(12) United States Patent
    Nam

(10) Patent No.: US 8,446,763 B2
(45) Date of Patent: May 21, 2013

(54) SEMICONDUCTOR MEMORY DEVICE, METHOD OF MANUFACTURING THE SAME, AND CELL ARRAY OF SEMICONDUCTOR MEMORY DEVICE

(75) Inventor: Sang Woo Nam, Chungbuk (KR)

(73) Assignee: Dongbu Hitek Co., Ltd., Seoul (KR)

( * ) Notice: Subject to any disclaimer, the term of this patent is extended or adjusted under 35 U.S.C. 154(b) by 163 days.

(21) Appl. No.: 12/980,541

(22) Filed: Dec. 29, 2010

(65) Prior Publication Data
    US 2011/0157979 A1    Jun. 30, 2011

(30) Foreign Application Priority Data
    Dec. 31, 2009  (KR) .................. 10-2009-0135802

(51) Int. Cl.
    *G11C 16/04*    (2006.01)
(52) U.S. Cl.
    USPC ................................ 365/185.01; 365/185.05
(58) Field of Classification Search
    USPC ............. 365/185.01, 185.05, 185.26, 185.28, 365/185.29
    See application file for complete search history.

(56) References Cited

U.S. PATENT DOCUMENTS

| | | | | |
|---|---|---|---|---|
| 5,514,889 A | * | 5/1996 | Cho et al. ...................... | 257/316 |
| 5,687,118 A | * | 11/1997 | Chang ...................... | 365/185.19 |
| 6,477,088 B2 | * | 11/2002 | Ogura et al. ............. | 365/185.29 |
| 2003/0161184 A1 | * | 8/2003 | Lee et al. .................. | 365/185.3 |
| 2007/0195595 A1 | * | 8/2007 | Seo et al. ................. | 365/185.01 |

* cited by examiner

*Primary Examiner* — Vu Le
(74) *Attorney, Agent, or Firm* — Saliwanchik, Lloyd & Eisenschenk

(57) ABSTRACT

A semiconductor memory device, a method of manufacturing the same, and a cell array of a semiconductor memory device are provided. The semiconductor memory device includes: a first gate insulation layer and a second gate insulation layer, being spaced a predetermined distance from each other, on a portion of a semiconductor substrate; a select gate on the first gate insulation layer; a floating gate on the second gate insulation layer; a third gate insulation layer on the floating gate; a control gate on the third gate insulation layer; a first ion implantation region in the semiconductor substrate between the select gate and the floating gate; a second ion implantation region in the semiconductor substrate at a side of the select gate opposite the first ion implantation region; and a third ion implantation region in the semiconductor substrate at a side of the floating gate opposite the first ion implantation region.

9 Claims, 2 Drawing Sheets

SEMICONDUCTOR MEMORY DEVICE, METHOD OF MANUFACTURING THE SAME, AND CELL ARRAY OF SEMICONDUCTOR MEMORY DEVICE

CROSS-REFERENCE TO RELATED APPLICATION

This application claims the benefit under 35 U.S.C. §119 of Korean Patent Application No. 10-2009-0135802, filed Dec. 31, 2009.

BACKGROUND

The present disclosure relates to a semiconductor memory device, a method of manufacturing the same, and a cell array of a semiconductor memory device.

ETOX (EPROM with Tunnel Oxide) memory is a type of erasable programmable read only memory (EPROM) non-volatile memory (NVM). In a 2 Transistor (T) N-type ETOX cell, if the 2T N-type ETOX cell is programmed through a Channel Hot Electron Injection (CHEI) method, current consumption is increased. Also, if the 2T N-type ETOX cell is programmed through a Band-to-Band-Tunneling (BTBT) Assisted Hot Hole Injection method, its operating speed is deteriorated so that it becomes vulnerable to disturbance.

BRIEF SUMMARY

Embodiments provide a semiconductor memory device capable of accurately controlling current and improving a program speed through a BTBT Assisted Hot Electron Injection method during a program operation and accurately and promptly controlling an erase operation by the minimum bit cell unit through a Hot Hole Injection (HHI) method during an erase operation; a method of manufacturing a semiconductor memory device; and a cell array of a semiconductor memory device.

In one embodiment, a semiconductor memory device includes: a first gate insulation layer and a second gate insulation layer, being spaced a predetermined distance from each other, on a portion of a semiconductor substrate; a select gate on the first gate insulation layer; a floating gate on the second gate insulation layer; a third gate insulation layer on the floating gate; a control gate on the third gate insulation layer; a first ion implantation region in the semiconductor substrate between the select gate and the floating gate; a second ion implantation region in the semiconductor substrate at an opposite side of the select gate; a third ion implantation region in the semiconductor substrate at an opposite side of the floating gate.

In another embodiment, a method of manufacturing a semiconductor memory device includes: forming a first gate insulation layer and a second gate insulation layer, being spaced a predetermined distance apart from each other, on a portion of a semiconductor substrate; forming a select gate on the first gate insulation layer and forming a floating gate on the second gate insulation layer; forming a third gate insulation layer on the floating gate; forming a control gate on the third gate insulation layer; forming a first ion implantation region in the semiconductor substrate between the select gate and the floating gate, forming a second ion implantation region in the semiconductor substrate at an opposite side of the select gate, and forming a third ion implantation region in the semiconductor substrate at an opposite side of the floating gate.

In yet another embodiment, a cell array of the semiconductor memory device is provided. When looking at a plan view of the cell array, the first ion implantation region is disposed at the middle between the floating gate and the select gate; two pairs of the floating gates and the control gates are disposed side by side at one side of the first ion implantation region; a pair of two select gates arranged side by side is disposed beside the floating gate at the other side of the first ion implantation region; the third ion implantation region is disposed between the pair of two floating gates/control gates stacks; and the second ion implantation region is disposed between the pair of two select gates.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings.

Hereinafter, a semiconductor memory device, a method of manufacturing the same, and a cell array of a semiconductor memory device according to embodiments will be described with reference to the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

Figure 1:
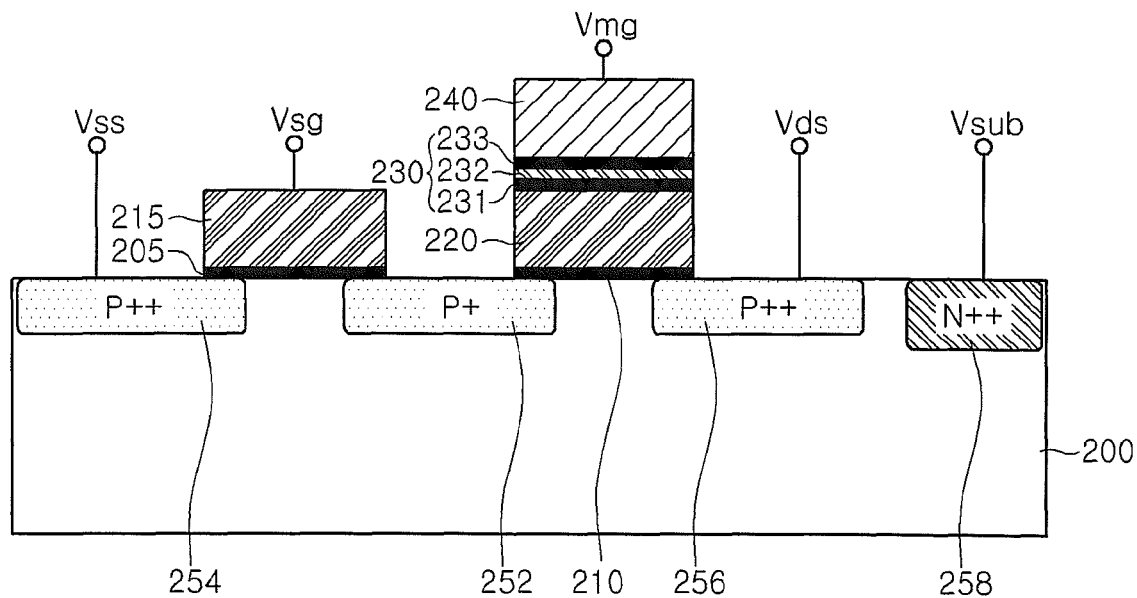
FIG. 1 is a cross-sectional view schematically illustrating a configuration of a semiconductor memory device according to an embodiment.

FIG. 1 is a cross-sectional view schematically illustrating a configuration of a semiconductor memory device according to an embodiment.

According to an embodiment, the semiconductor memory device can include a semiconductor substrate 200, a first gate insulation layer 205, a second gate insulation layer 210, a select gate 215, a floating gate 220, a third gate insulation layer 230, a control gate 240, a first ion implantation region 252, a second ion implantation region 254, a third ion implantation region 256, and a fourth ion implantation region 258.

Referring to FIG. 1, a first gate insulation layer 205 is formed on a semiconductor substrate 200, and a second gate insulation layer 210 spaced a predetermined distance from the first gate insulation layer 205 is formed on the semiconductor substrate 200.

The semiconductor substrate 200 may be a substrate including a second conductive type well thereon or a second conductive type sub substrate.

Next, a select gate 215 is formed on the first gate insulation layer 205, and a floating gate 220 is formed on the second gate insulation layer 210.

A third gate insulation layer 230 is formed on the floating gate 220 and a control gate 240 is formed on the third gate insulation layer 230.

The floating gate 220 and the control gate 240 may constitute a memory gate.

Gate voltages Vsg and Vmg are applied to the select gate 215 and the memory gates 220 and 240, respectively.

The third gate insulation layer 230 may include a structure of an Oxide-Nitride-Oxide (ONO) layer 231, 232, and 233.

Once the gates 215, 220, and 240 are formed, a first ion implantation region 252 is formed in the semiconductor substrate 200 between the select gate 215 and one side of the floating gate 220 and a second ion implantation region 254 is formed in the semiconductor substrate 200 at a side of the select gate 215 opposite the first ion implantation region 252 by implanting a first conductive type ion.

Moreover, a third ion implantation region 256 may be formed in the semiconductor substrate 200 at the side of the floating gate 220 opposite the one side of the floating gate 220. According to an embodiment, the ion doping concentration of the first ion implantation region is lower the ion doping concentration of the second ion implantation region and the third ion implantation region.

In an embodiment, the second ion implantation region 254 may serve as a source region of the select gate 215 to which a source voltage Vss is applied and the third ion implantation region 256 may serve as a drain region of the floating gate 220 to which a drain voltage Vds is applied.

Moreover, the first ion implantation region 252 may serve a drain region of the select gate 215 and a source region of the floating gate 220.

A fourth ion implantation region 258 may be formed to apply a voltage Vsub to the semiconductor substrate 200 by implanting a second conductive type ion on the semiconductor substrate 200 beside the third ion implantation region 256.

The fourth ion implantation region 258 may be spaced apart from the third ion implantation region 256.

In an embodiment, the first conductive type ion can be a P-type impurity ion and the second conductive type ion can be an N-type impurity ion.

Figure 2:
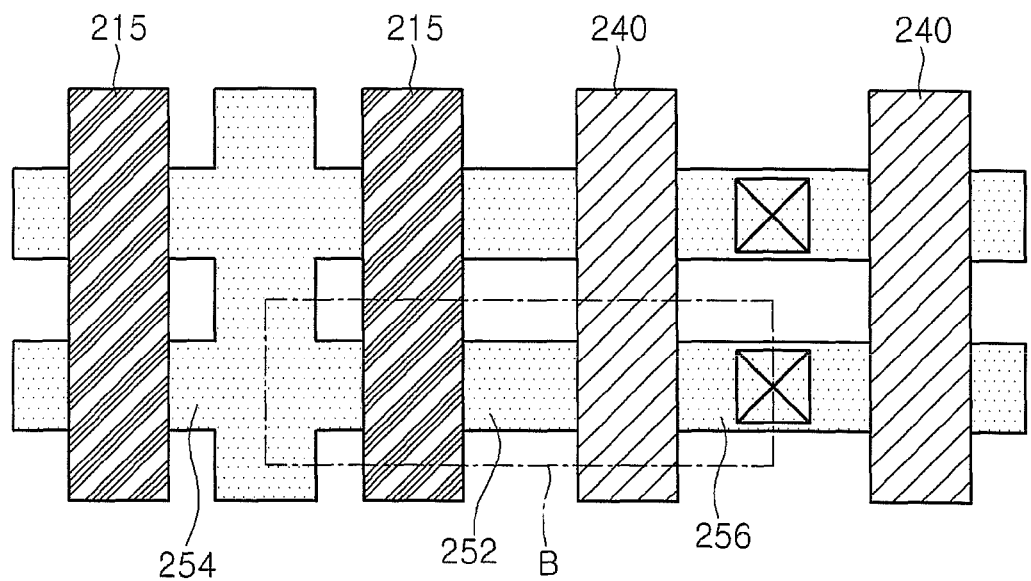
FIG. 2 is a plan view schematically illustrating a configuration of a cell array of a semiconductor memory device according to an embodiment.
Figure 3:
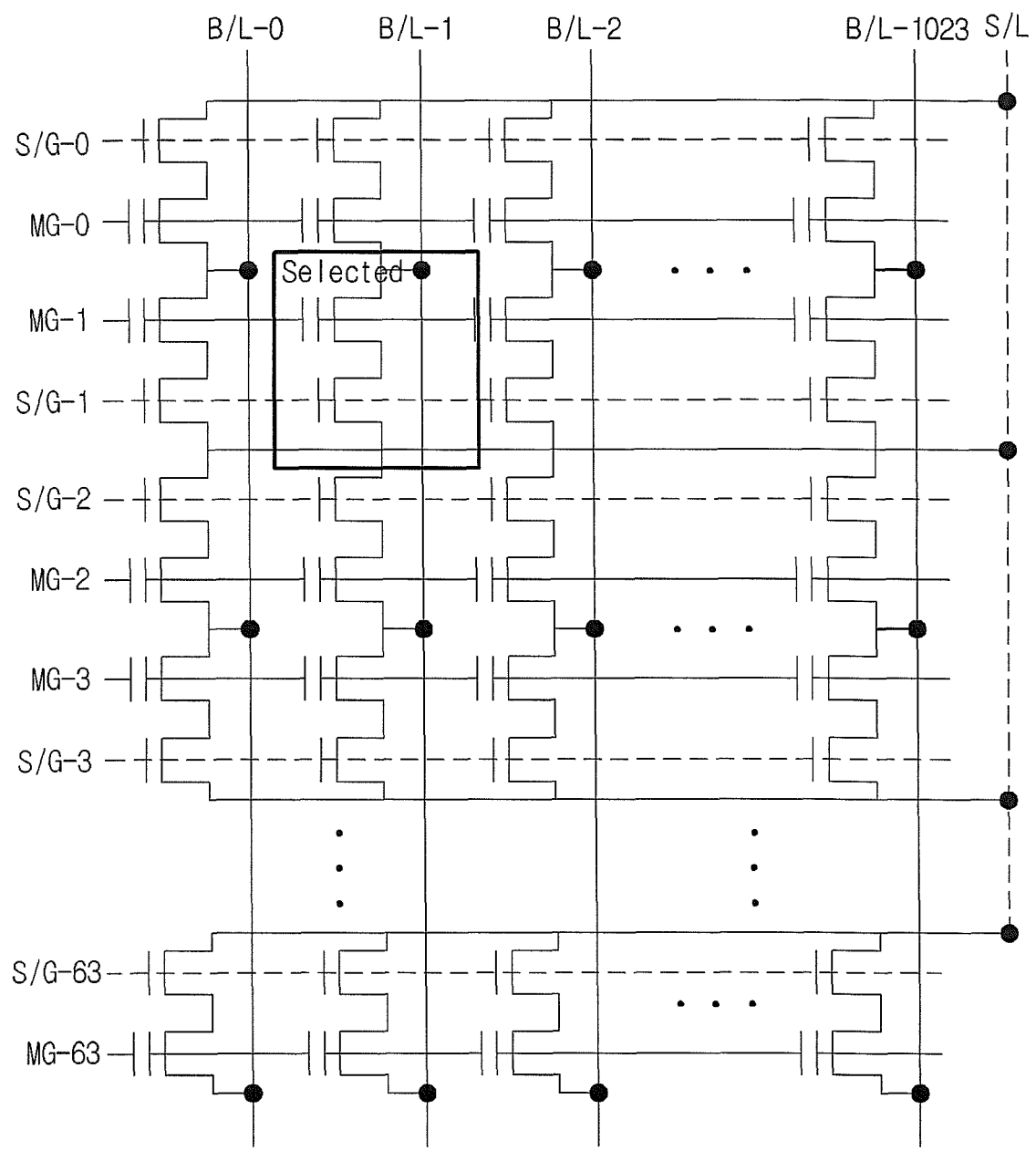
FIG. 3 is an exemplary view of a semiconductor memory according to an embodiment.

FIG. 2 is a plan view schematically illustrating a configuration of a cell array of a semiconductor memory device according to an embodiment. FIG. 3 is an exemplary view of a semiconductor memory according to an embodiment.

Referring to FIG. 2, a pair of two stacks of the floating gates 220 and the control gates 240 is arranged side by side, and a pair of two select gates 215 is arranged beside the pair of the two floating gate 220/control gate 240 stacks.

The third ion implantation region 256 may be formed between the floating gates 220; the second ion implantation region 254 may be formed between the pair of select gates 215; and the first ion implantation region 252 may be formed between a floating gate of the pair of the floating gate 220/control gate 240 stacks and the select gate 215 closest to the floating gate. Accordingly, an array is configured to allow a bias applied to the second ion implantation region 254 to be controlled through the select gate 215. A region "B" means a unit cell shown in FIG. 1.

Hereinafter, a method of operating a semiconductor memory device according to a second embodiment will be described in detail.

TABLE 1

| Operation | Mode | Vmg | Vsg | Vss | Vds | Vsub |
|---|---|---|---|---|---|---|
| Program | Selected CG & BL | HV (8~12 V) | Vref | Vref/Floating | −HV (−4~−6 V) | Vref |
|  | Unselected CG & selected BL | Vref | Vref | Vref/Floating | −HV (−4~−6 V) | Vref |
|  | Unselected BL & Selected CG | HV (8~12 V) | Vref | Vref/Floating | Floating | Vref |
|  | Unselected CG & Unselected BL | Vref | Vref | Vref/Floating | Floating | Vref |
| Erase | Block | −HV (−8~−12 V) | 1.8 V(Vcc) | HV(6~9 V) | Floating | HV(6~9 V) |
| Read | Unit cell read | Vcc −1.8 V | Vcc −3.6 V | Vcc | Vcc/2 | Vcc |

The Table 1 is an operation condition when there is no inhibition in an unselected unit cell. For example, Table 1 shows an operation condition when there is no inhibition in an unselected Control Gate (CG). The reference voltage (Vref) may include at least one of Ground voltage or 0 V. BL refers to bit line.

In an embodiment, in order to program a selected bit cell through a BTBT Assisted Hot Electron Injection method, i.e., a program method, +HV Bias is applied to a control gate (Vmg) and −HV Bias is applied to a bit line (Vds). A source (Vss) can be 0 V or floating, the select gate voltage (Vsg) and Vsub can be 0 V. The voltages Vmg, Vsg, and Vdd are applied as indicated in Table 1 for the remaining bit cells.

An erase operation is performed by a block unit and −HV is applied to Vmg and +HV is applied to Vsub and Vss so that a FN erase operation is accomplished through a channel.

A read operation is to read a state of a programmed and erased bit cell. A program state is "on current" and the erase state is "off current". An operation condition is as shown in Table 1.

Operations of Program, Read, and Erase will be described in more detail below.

First, when the semiconductor memory device according to an embodiment operates in a program state, a first voltage of positive potential is applied to the control gate 240 and the select gate 215 is grounded.

Moreover, a first voltage of negative potential is applied to the third ion implantation region 256, and the second ion implantation region 254 and the fourth ion implantation region 258 are connected to a reference voltage.

Accordingly, since the semiconductor memory device operates through a BTBT Assisted Hot Electron Injection method such that electrons are implanted on the floating gate 220, current may be accurately controlled in a level of about several tens nA.

Accordingly, a program speed may be in a level of about 5 μsec to about 20 μsec.

Additionally, as mentioned above, according to an embodiment, since the third ion implantation region 256 adjacent to the side of the floating gate 220 serves as a drain region and the second ion implantation region 254 adjacent to the side of the select gate 215 serves as a source region, an applied voltage of the select gate 215 may become unnecessary and BTBT Induced Hot Election Injection effect may become more improved.

Second, when the semiconductor memory device according to the second embodiment operates in an erase state, a first voltage of negative potential is applied to the control gate 240 and a second voltage of negative potential is applied to the select gate 215.

Moreover, the third voltage of negative potential is applied to the third ion implantation region 256, and the second ion implantation region 254 and the fourth ion implantation region 258 are connected to a reference voltage.

The second voltage of negative potential is less than the sum of the third voltage of negative potential and a threshold voltage of the select gate 215.

In this case, through an HHI method, an erase operation may be performed by the minimum bit cell unit.

Accordingly, since electrons trapped in the floating gate 220 may be accurately and promptly erased through holes, a degradation phenomenon of a threshold voltage may be inhibited from occurring.

Third, an HHI method is applied during an erase operation so that it is accurately and promptly controlled by the minimum bit cell unit. Additionally, a degradation phenomenon of a threshold voltage may be inhibited from occurring.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the

TABLE 2

| Operation | Mode | Vmg | Vsg | Vss | Vds | Vsub |
|---|---|---|---|---|---|---|
| Program | Selected CG & BL | HV (8~12 V) | Vref | Vref | −HV (−4~−6 V) | Vref |
|  | Unselected CG & selected BL | −HV (−3 V~−6 V) | Vref | Vref | −HV (−4~−6 V) | Vref |
|  | Unselected BL & Selected CG | HV (8~12 V) | Vref | Vref | Floating | Vref |
|  | Unselected CG & Unselected BL | −HV (−3 V~−6 V) | Vref | Vref | Floating | Vref |
| Erase | Block | −HV (−8~−12 V) | 1.8 V(Vcc) | HV (6~9 V) | Floating | HV (6~9 V) |
| Read | Unit cell read | Vcc −1.8 V | Vcc −3.6 V | Vcc | Vcc/2 | Vcc |

The Table 2 is an operation condition when there is inhibition in an unselected unit cell. For example, Table 2 shows an operation condition when there is inhibition in an unselected Control Gate.

For example, a predetermined negative voltage may be applied to the unselected control gate as shown in Table 2 when there is inhibition in an unselected Control Gate.

For example, −HV may be applied to unselected Control Gate to inhibit the unselected control gate from being programmed by injection of electron.

According to embodiments, a drain disturbance may be minimized with Inhibition Operation Condition.

According to embodiments where a bit line is connected directly to the control gate, Inhibition Operation Condition may serve as an effective safe mechanism to inhibit the drain disturbance.

According to an embodiment, the following effects are given.

First, a memory gate of a semiconductor memory device such as a nonvolatile memory (NVM) may be realized with a 2T ETOX cell using an ONO nitride layer trap.

Second, accordingly, current may be accurately controlled in a level of about several tens nA through a BTBT Assisted Hot Electron Injection method during a program operation and a program speed may be in a level of about 5 μsec to about 20 μsec.

component parts and/or arrangements, alternative uses will also be apparent to those skilled in the art.

What is claimed is:

1. A semiconductor memory device comprising:
  a first gate insulation layer and a second gate insulation layer, being spaced a predetermined distance from each other, on a portion of a semiconductor substrate;
  a select gate on the first gate insulation layer;
  a floating gate on the second gate insulation layer;
  a third gate insulation layer on the floating gate;
  a control gate on the third gate insulation layer;
  a first ion implantation region in the semiconductor substrate between the select gate and the floating gate;
  a second ion implantation region in the semiconductor substrate at a side of the select gate opposite the first ion implantation region; and
  a third ion implantation region in the semiconductor substrate at a side of the floating gate opposite the first ion implantation region;
  wherein the semiconductor memory device is configured such that during an operation of a program state for a selected unit cell,
  a first voltage of positive potential is applied to the control gate,
  the select gate is connected to a reference voltage, a first voltage of negative potential is applied to the third ion implantation region, and the second ion implantation region is connected to the reference voltage or is floated.

2. The semiconductor memory device according to claim 1, wherein the semiconductor substrate comprises a second conductive type well or a second conductive type sub substrate; and wherein the first ion implantation region, the second ion implantation region, and the third ion implantation region are regions implanted with a first conductive type ion.

3. The semiconductor memory device according to claim 1, wherein the third gate insulation layer comprises an Oxide-Nitride-Oxide (ONO) layer structure.

4. The semiconductor memory device according to claim 2, wherein the first conductive type ion is a P-type impurity ion.

5. The semiconductor memory device according to claim 1, wherein the second ion implantation region serves as a source region of the select gate and the third ion implantation region serves as a drain region of the floating gate.

6. The semiconductor memory device according to claim 1, wherein an ion doping concentration of the first ion implantation region is lower than an ion doping concentration of the second ion implantation region and the third ion implantation region.

7. The semiconductor memory device according to claim 1, wherein during the operation of the program state, an inhibition operation condition is applied to an unselected unit cell.

8. The semiconductor memory device according to claim 7, wherein the inhibition operation condition comprises applying a negative voltage to an unselected control gate of the unselected unit cell.

9. The semiconductor memory device according to claim 5, wherein the semiconductor memory device is configured such that during an operation of an erase state, a first voltage of negative potential is applied to the control gate;

a second voltage of positive potential is applied to the select gate;

the third ion implantation region is floating; and the second ion implantation region is connected to a reference voltage.

* * * * *